United States Patent
Shiratake et al.

(10) Patent No.: US 7,352,227 B2
(45) Date of Patent: Apr. 1, 2008

(54) SEMICONDUCTOR DEVICE HAVING PLURALITY OF CIRCUITS BELONGING TO DIFFERENT VOLTAGE DOMAINS

(75) Inventors: Shinichiro Shiratake, Yokohama (JP); Hiroyuki Hara, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/271,848

(22) Filed: Nov. 14, 2005

(65) Prior Publication Data

US 2006/0114048 A1    Jun. 1, 2006

(30) Foreign Application Priority Data

Nov. 15, 2004    (JP)    ............... 2004-330737

(51) Int. Cl.
*H03L 5/00*    (2006.01)
(52) U.S. Cl. ............ 327/333; 326/63; 326/68; 326/80; 326/81; 326/83
(58) Field of Classification Search ............... None
See application file for complete search history.

(56) References Cited

U.S. PATENT DOCUMENTS

2002/0039042 A1* 4/2002 Jinzai ................. 327/333
2006/0044014 A1* 3/2006 Chen et al. ............ 326/81

FOREIGN PATENT DOCUMENTS

JP    2002-50955    2/2002

OTHER PUBLICATIONS

Sung-Mo Kang, et al., "CMOS Digital Integrated Circuits Analysis and Design", McGraw-Hill International Editions Electrical Engineering Series, Second Edition, 1999, 5 pages.

* cited by examiner

*Primary Examiner*—Quan Tra
*Assistant Examiner*—Khareem E. Almo
(74) *Attorney, Agent, or Firm*—Oblon, Spivak, McClelland, Maier & Neustadt, P.C.

(57) ABSTRACT

A first inverter circuit comprises a first transistor in which one end of a current path is grounded, and a second transistor in which one end of a current path is connected to the other end of the current path of the first transistor. A first signal is supplied to gates of the first and second transistors. A third transistor is connected between the other end of the current path of the second transistor and a node to which a second voltage higher than the first voltage is supplied. A control signal constituted of one of the ground potential and the second voltage is supplied to a gate of the third transistor behind a change of a first signal. A second signal constituted of one of the ground potential and the second voltage is output from an output terminal of the first inverter circuit.

13 Claims, 6 Drawing Sheets

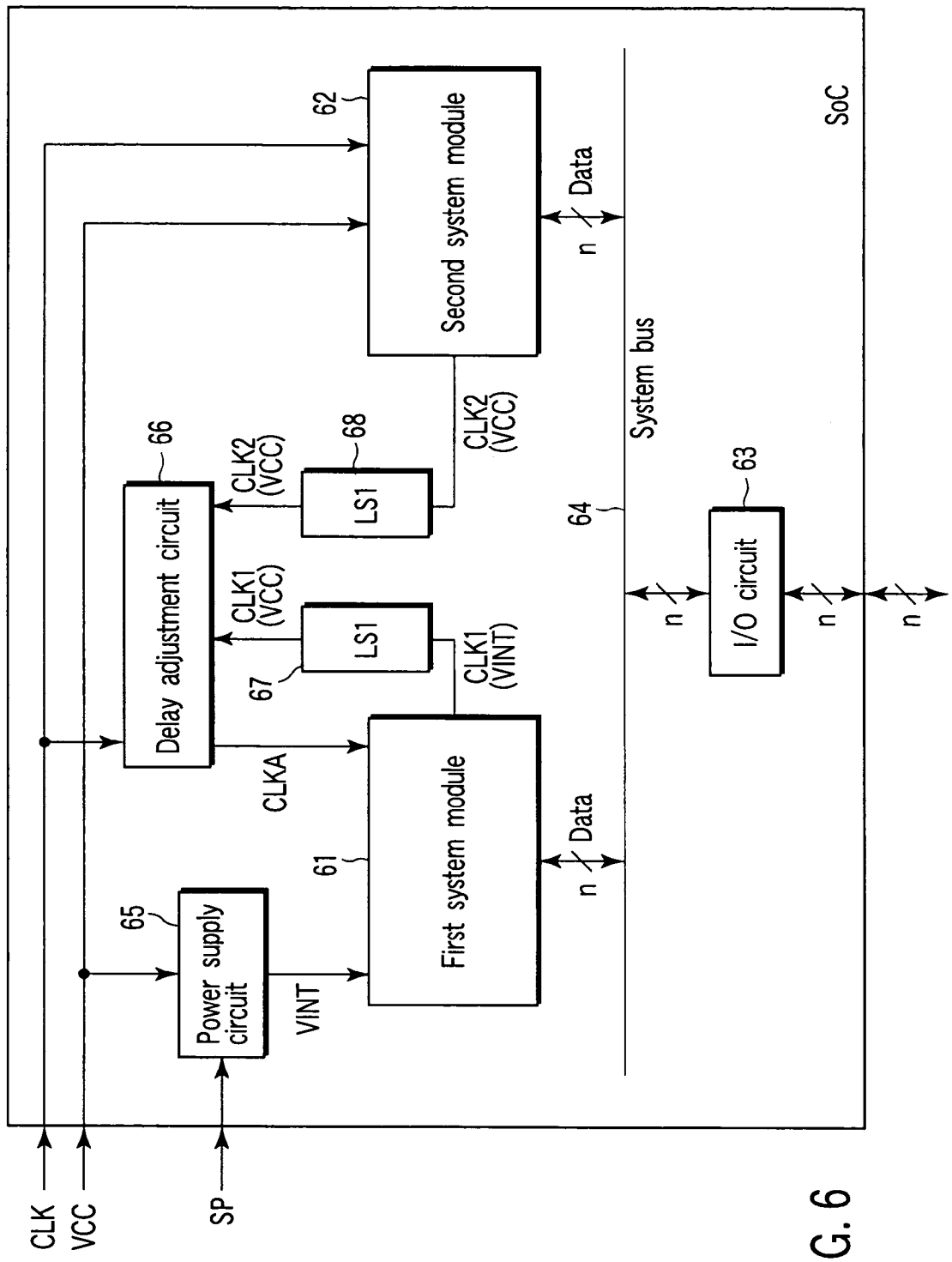
F I G. 6

SEMICONDUCTOR DEVICE HAVING PLURALITY OF CIRCUITS BELONGING TO DIFFERENT VOLTAGE DOMAINS

CROSS-REFERENCE TO RELATED APPLICATIONS

This application is based upon and claims the benefit of priority from prior Japanese Patent Application No. 2004-330737, filed Nov. 15, 2004, the entire contents of which are incorporated herein by reference.

BACKGROUND OF THE INVENTION

1. Field of the Invention

The present invention relates to a semiconductor device which transmits signals among, e.g., a plurality of logical circuits operated by different voltages.

2. Description of the Related Art

Conventionally, in the case of transmitting signals among a plurality of logical circuits of different operation voltages, level conversion circuits have been disposed among the logical circuits. For example, the level conversion circuit converts voltage amplitude V1 of an input signal into higher voltage amplitude V2 to output it. That is, the level conversion circuit outputs a signal of a low level ("L"=0 V) when an input signal is a low level ("L"=0 V), and a signal of a high level ("H"=V2>V1) when an input signal is a high level ("H"=V1) (e.g., p. 543 of "CMOS Digital Integrated Circuit, Analysis and Design (Second edition)" by Sung-Mo Kang, Yusuf Leblebici, McGraw-Hill, 1999).

This circuit has a problem that transmission time from supplying of the input signal to outputting of the output signal is slower when a difference between the voltages V1 and V2 is large as compared with that when a difference therebetween is small. In other words, there is a problem that time until a change of the input signal from "L" to "H" or "H" to "L" after a change of the input signal from "L" to "H" or "H" to "L" is changed depending on a difference between the voltages V1 and V2.

There has recently been developed a system-on-chip (SoC) device which comprises a plurality of logical circuits operated by a plurality of voltages in one chip. To transmit signals among the logical circuits which belong to different voltage domains, this SoC device needs a level conversion circuit. In the case of using the conventional circuit, however, as a difference occurs in signal transmission time depending on a difference between operation voltages, a certain margin must be provided to signal transmission timing at a design stage. Consequently, it has been difficult to increase an operation speed of the SoC device. Therefore, there is a demand for a semiconductor device which can transmit signals among circuits belonging to different voltage domains at a high speed.

BRIEF SUMMARY OF THE INVENTION

According to a first aspect of the invention, there is provided a level conversion circuit comprising a first inverter circuit having first and second transistors of first and second conductive types, one end of a current path of the first transistor being grounded, the other end thereof being connected to one end of a current path of the second transistor of the second conducive type, and a first input signal constituted of one of a ground potential and a first voltage higher than the ground potential being supplied to gates of the first and second transistors; and a third transistor of a second conductive type connected between the other end of the current path of the second transistor and a second voltage higher than the first voltage, a control signal constituted of one of the ground potential and the second voltage being supplied to a gate of the third transistor behind a change of the first input signal, wherein a first output signal constituted of one of the ground potential and the second voltage is output from an output end of the first inverter circuit.

According to a second aspect of the invention, there is provided a level conversion circuit comprising a first second transistor of a first conductive type, a first input signal constituted of one of a ground potential and a first voltage higher than the ground potential being supplied to a gate thereof, and one end of a current path being grounded; and a second transistor of a second conductive type connected between the other end of the current path of the first transistor and a second voltage higher than the first voltage, a control signal constituted of one of the ground potential and the second voltage being supplied to a gate of the second transistor behind a change of the first input signal, wherein a second output signal constituted of one of the ground potential and the second voltage is output from the other end of the current path of the first transistor.

According to a third aspect of the invention, there is provided a semiconductor device comprising: a first logical circuit driven by a first voltage and a first clock signal to output a second clock signal of the first voltage; a second logical circuit driven by a second voltage higher than the first voltage and a third clock signal as a reference to output a fourth clock signal of the second voltage; a level conversion circuit which converts the second clock signal output from the first logical circuit into a second clock signal of the second voltage; and a delay control circuit to which the second clock signal of the second voltage output from the level conversion circuit, the fourth clock signal of the second voltage output from the second logical circuit, and the third clock signal are supplied, and which detects a skew amount between the second and fourth clock signals, and which generates the first clock by delaying the third clock in accordance with the detected skew amount between the second and fourth clock signals.

BRIEF DESCRIPTION OF THE SEVERAL VIEWS OF THE DRAWING

FIG. 6 is a block diagram showing a level conversion circuit according to a sixth embodiment;

DETAILED DESCRIPTION OF THE INVENTION

The preferred embodiments of the present invention will be described below with reference to the accompanying drawings.

First Embodiment

Figure 1:
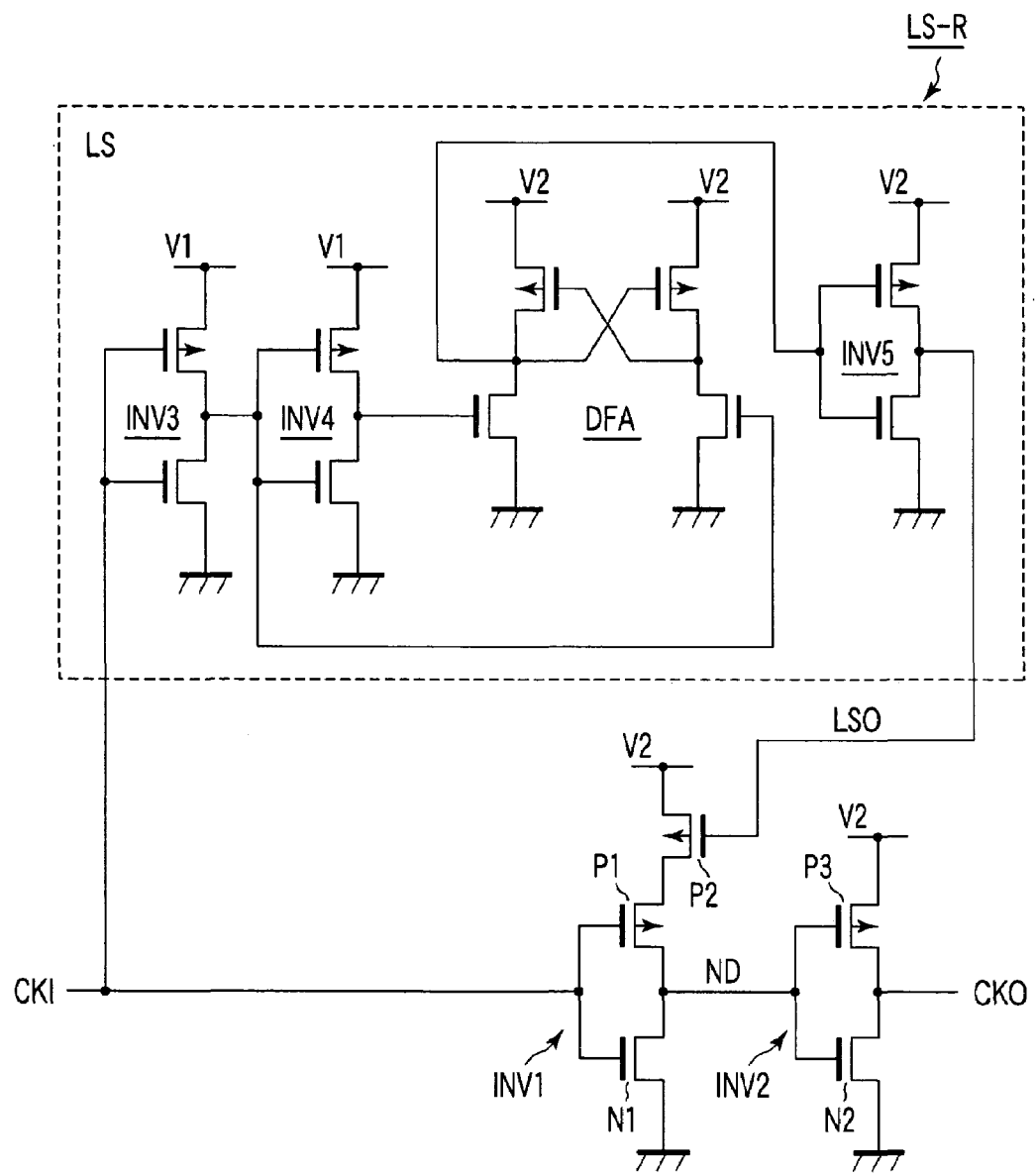
FIG. 1 is a circuit diagram showing a level conversion circuit according to a first embodiment.

FIG. 1 shows a level conversion circuit LS-R as a semiconductor device according to the first embodiment. This level conversion circuit LS-R comprises inverter circuits INV1, INV2, and a level conversion circuit LS as a control circuit.

Referring to FIG. 1, an input signal CKI of the level conversion circuit LS-R is set to one of voltages "L" (e.g., ground potential=0 V) and "H" (first voltage V1). An output signal CKO is set to one of voltages "L" (e.g., ground potential=0 V) and "H" (second voltage). The second voltage is set to a voltage higher than the first voltage V1 (V1<V2).

The input signal CKI is input to gates of an N channel MOS transistor (referred to as NMOS transistor hereinafter) N1 and a P channel MOS transistor (referred to as a PMOS transistor hereinafter) P1 constituting the inverter circuit INV1, and an input end of the level conversion circuit LS. A source of the NMOS transistor N1 is connected to a supply node of the ground potential, and a source of the PMOS transistor P1 is connected to a drain of a PMOS transistor P2. A source of the PMOS transistor P2 is connected to a supply node of the second voltage V2. An output signal LSO of the level conversion circuit LS is supplied to a gate of the PMOS transistor P2. A drain of the transistor N1, the P2, i.e., an output end ND of the inverter circuit INV1, is connected to an input end of the inverter circuit INV2. This inverter circuit INV2 comprises a PMOS transistor P3 and an NMOS transistor N2, and is driven by the second voltage V2. The output signal CKO is output from an output end of the inverter circuit INV2.

A driving efficiency of the NMOS transistor N1 is set higher than a total of driving efficiencies of the PMOS transistors P1, P2. That is, for example, a gate width of the NMOS transistor N1 is set larger than those of the PMOS transistors P1, P2. Alternatively, a gate length of the PMOS transistor P2 is set larger than that of the NMOS transistor N1.

The level conversion circuit LS comprises inverter circuits INV3, INV4, and INV5, and a differential amplifier circuit DFA. The serially connected inverter circuits INV3, INV4 are driven by the first voltage V1 to sequentially transmit the input signal CKI. The differential amplifier circuit DFA and the inverter circuit INV5 are driven by the second voltage V2. The differential amplifier circuit DFA amplifies a voltage difference between signals of the input and output ends of the inverter circuit INV4 supplied to the gates of the two NMOS transistors. The inverter circuit INV5 transmits an output signal of the differential amplifier circuit DFA.

Figure 8:
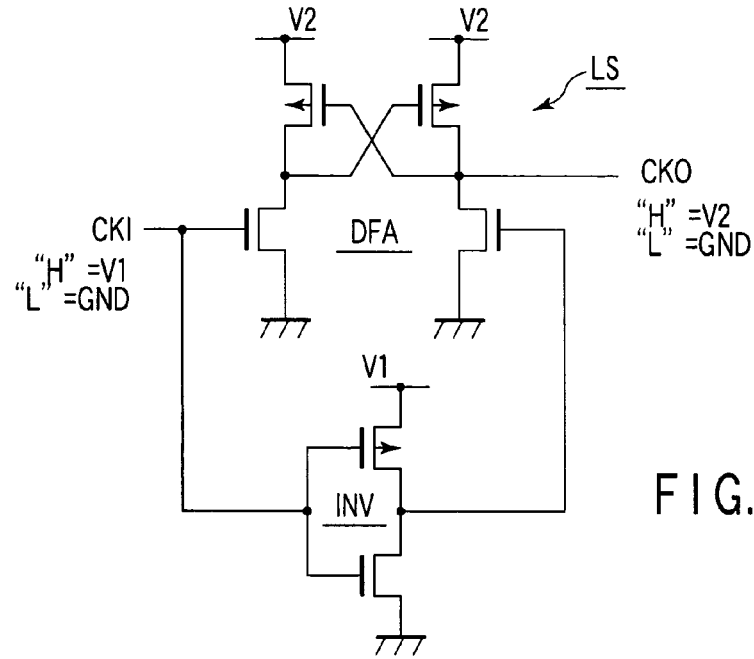
FIG. 8 is a circuit diagram showing an example of a conventional level conversion circuit.
Figure 9:
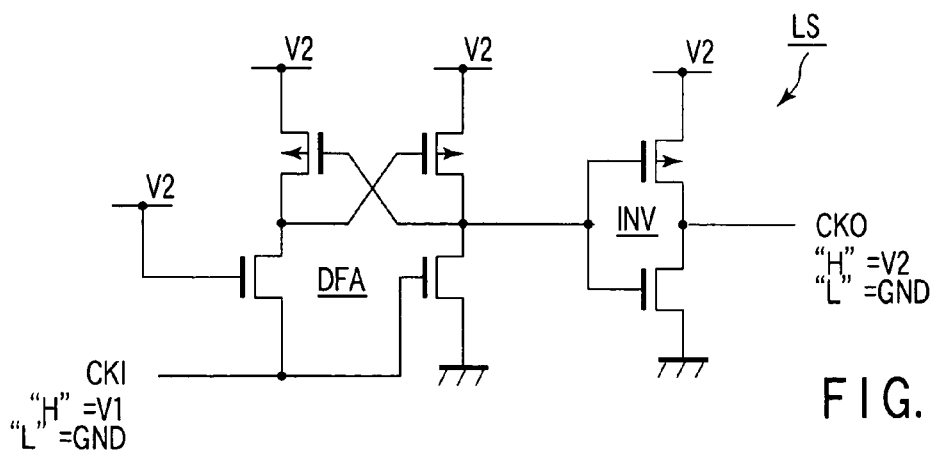
FIG. 9 is a circuit diagram showing another example of a conventional level conversion circuit.

In the level conversion circuit LS, when the input signal CKI changes from "L" to "H", an output signal LSO becomes "H" (second voltage V2) a certain time behind the change of the input signal CKI. A configuration of the level conversion circuit is not limited to the configuration shown in FIG. 1. For example, level conversion circuits shown in FIGS. 8, 9 can be applied.

An operation of the circuit of FIG. 1 configured in the aforementioned manner will be described. Consideration will be given to a case in which the input signal CKI changes from the ground potential to the first voltage V1. In a standby state, the input signal CKI is "L" (ground potential) and the output signal LSO of the level conversion circuit LS is "L" (ground potential). Thus, the PMOS transistor P2 is in an on state. The PMOS transistor is similarly in an on state. As a result, the output end ND of the inverter circuit INV1 is "H" (second voltage), and the output signal CKO of the inverter circuit INV2 is "L" (ground potential).

On the other hand, when the input signal CKI becomes "H" (first voltage V1), the gate of the NMOS transistor N1 is first set to the first voltage V1, thereby turning the NMOS transistor on. The PMOS transistor is not completely set in an on state because of V1<V2. Besides, the output signal LSO of the level conversion circuit LS becomes "H" with a passage of delay time of the level conversion circuit LS after the input signal CKI becomes "H". Consequently, a gate voltage of the PMOS transistor P2 is 0V until the signal LSO becomes "H". Therefore, the PMOS transistor P2 is maintained in the on state.

In this case, as the driving efficiency of the NMOS transistor N1 is higher than those of the PMOS transistors P1, P2, a potential of the output end ND is lower than a logical threshold value of the inverter INV2. Thus, the inverter circuit INV2 is instantaneously inverted when the potential of the output end ND is lowered to set the output signal CKO to "H" (second voltage V2). As a result, when the input signal CKI becomes "H" (first voltage V1), the output signal CKO of the inverter circuit INV2 becomes "H" before the output signal of the level conversion circuit LS becomes "H" (second voltage V2). In other words, the level conversion circuit LS-R shown in FIG. 1 can transmit information on a change of the input signal from "L" to "H" faster than in the conventional case.

Immediately after the input signal CKI has become "H", the potential of the output end ND is lowered, the PMOS transistor P1 is not completely set in an off state, and the PMOS transistor P2 is maintained on. Consequently, a leakage current flows through the PMOS transistors P2, P1 and the NMOS transistor N1. However, this state is eliminated when the output signal of the level conversion circuit LS becomes "H" to turn the PMOS transistor P2 off. Usually, signal transmission time of the level conversion circuit LS is several tens of picoseconds to several hundreds of picoseconds, or 1 nanosecond or less at the worst. Hence, even when a through-current flows until the PMOS transistor P2 is tuned off after the change of the input signal CKI from "L" to "H", it is only instantaneous, and the leakage current does not constantly flow. Additionally, when the input signal CKI is "H", a current driving efficiency of the PMOS transistor P1 is reduced as the gate is set to the first voltage V1. Therefore, the PMOS transistor also serves to reduce the instantaneous through-current.

According to the first embodiment, the PMOS transistor P2 driven by the second voltage is connected to a current path of the inverter circuit INV1 whose input end the input signal CKI is supplied to, and the gate of this PMOS transistor P2 is controlled based on the output signal of the level conversion circuit LS. The level conversion circuit LS converts "H" of the first voltage V1 of the input signal CKI into "H" of the second voltage V2 after certain delay time. Thus, the inverter circuit INV1 can immediately output the signal of "H" of the second voltage when the input signal CKI changes from "L" to "H". As a result, the level conversion circuit LS-R can transmit signals among the circuits belonging to different voltage domains at a high speed.

Effects of the first embodiment emerge when the first voltage V1 is lower than the second voltage V2. However, the first embodiment can be applied even when the first voltage V1 is equal to the second voltage V2, or when the first voltage V1 is larger than the second voltage V2. Moreover, a relation between the first and second voltages V1 and V2 may be changed depending on an operation state.

Second Embodiment

Figure 2:
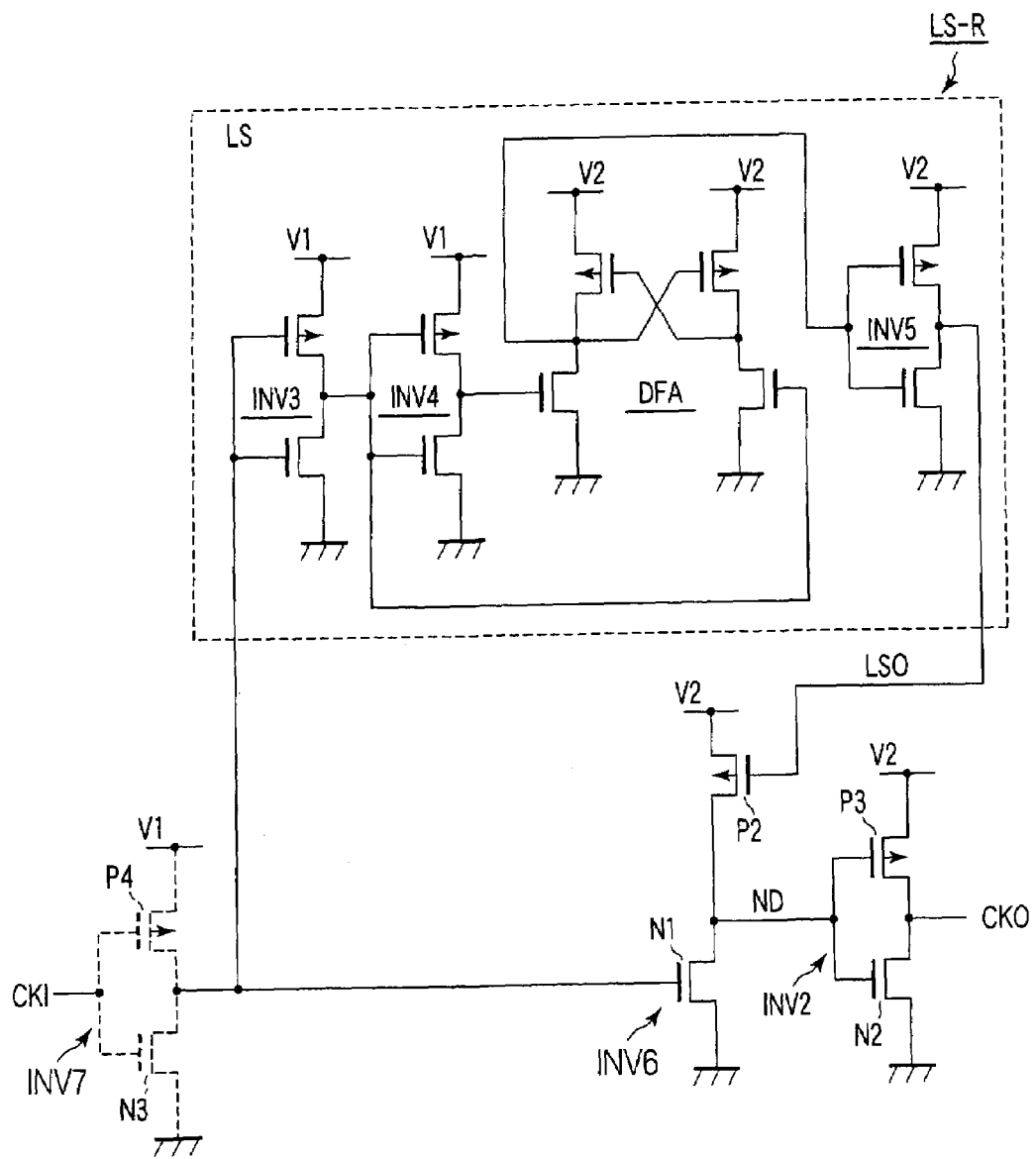
FIG. 2 is a circuit diagram showing a level conversion circuit according to a second embodiment.

FIG. 2 shows a level conversion circuit LS-R according to a second embodiment. In this level conversion circuit LS-R, as in the above, "L", i.e., 0 V, is output for an output signal CKO when an input signal CKI is "L", i.e., 0 V, and "H", i.e., a second voltage V2, is output for an output signal CKO when the input signal CKI is "H", i.e., a first voltage V1. The first voltage V1 is generally set lower than the second voltage. However, this is in no way limitative of a voltage relation.

Referring to FIG. 2, an inverter circuit INV6 has a configuration in which the PMOS transistor P1 is removed from the inverter circuit INV1 of FIG. 1. According to the second embodiment, as in the case of the first embodiment, a driving efficiency of an NMOS transistor N1 is set larger than that of a PMOS transistor P2.

An operation of the circuit shown in FIG. 2 is almost similar to that of the circuit of FIG. 1. That is, when the input signal CKI is "L", the NMOS transistor N1 is off, and an output signal LSO of the level conversion circuit LS is "L". Accordingly, the PMOS transistor P2 is on, and a potential of an output end ND of the inverter circuit INV6 becomes "H" (second voltage V2). As a result, an output signal of an inverter circuit INV2 to which this signal is supplied is "L".

On the other hand, when the input signal CKI changes from "L" to "H", the NMOS transistor N1 is quickly turned on, and the potential of the output end ND of the inverter circuit INV6 becomes "L". Thus, an output signal CKO of the inverter circuit INV2 is quickly changed from "L" to "H". Subsequently, when the output signal of the level conversion circuit LS becomes "H" (second voltage V2), the PMOS transistor P2 is turned off, and a through-current is blocked.

According to the second embodiment, as in the case of the first embodiment, when the input signal CKI changes from "L" to "H" of the first voltage V1, a signal of "H" of the second voltage V2 can be output at a high speed. Besides, according to the second embodiment, as the number of PMOS transistors constituting the inverter circuit INV6 is smaller as compared with that of the first embodiment, when the input signal CKI changes from "L" to "H", it is possible to output an output signal CKO faster as compared with the first embodiment.

Furthermore, according to the second embodiment, the number of PMOS transistors can be reduced as compared with the first embodiment. As a result, it is possible to miniaturize the circuit.

Third Embodiment

Figure 3:
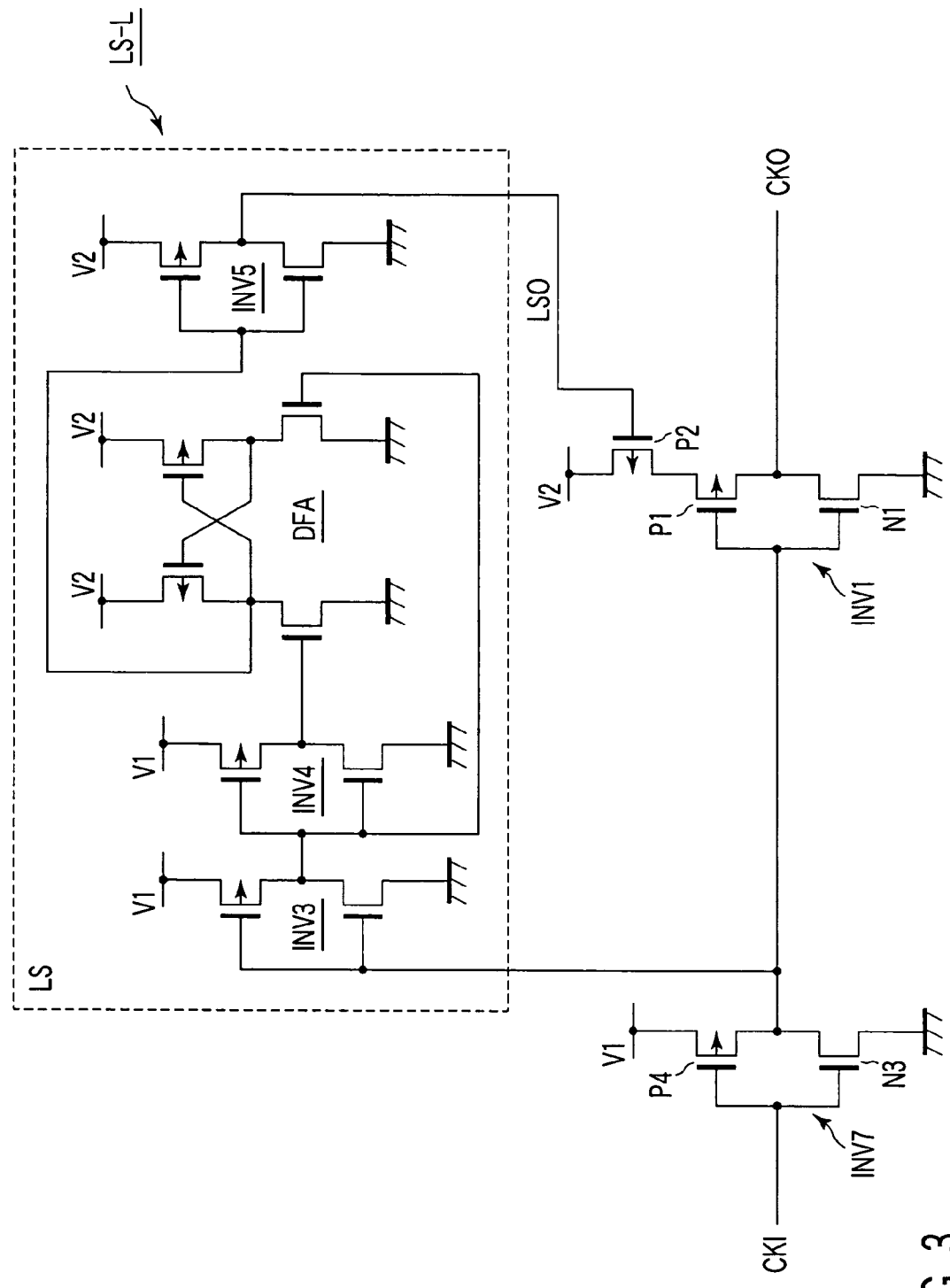
FIG. 3 is a level conversion circuit showing a level conversion circuit according to a third embodiment.

FIG. 3 shows a level conversion circuit LS-L according to a third embodiment. The first and second embodiments have been described by way of case in which a high speed is achieved for the rising of the output signal. Conversely, according to the third embodiment, a high speed is achieved for falling of an output signal.

Referring to FIG. 3, an input signal CKI is supplied to an inverter circuit INV7. This inverter circuit INV7 comprises an NMOS transistor N3 and a PMOS transistor P4, and is driven by a first voltage V1. An output signal of the inverter circuit INV7 is supplied to an input end of an inverter circuit INV1. The inverter circuit INV1 is similar in configuration to that of the first embodiment. Additionally, an output signal of the inverter circuit INV7 is supplied to the level conversion circuit LS. An output signal LSO of the level conversion circuit LS is supplied to a gate of the PMOS transistor P2 constituting the inverter circuit INV1. An output signal CKO of the level conversion circuit LS-L is output from an end of the inverter circuit INV1.

An operation of the circuit configured in the aforementioned manner will be described.

When the input signal CKI is "H" (first voltage), an output signal of the inverter circuit INV7 becomes "L" (0 V). For the inverter circuit INV1 to which this signal is supplied, the NMOS transistor N1 is turned off while the PMOS transistor P2 is turned on. Further, as the output signal LSO of the level conversion circuit LS supplied to a gate of the PMOS transistor P2 is "L", the PMOS transistor P2 is on. Accordingly, the output signal CKO is "H" (second voltage V2).

On the other hand, when the input signal CKI changes from "H" to "L" (0 V), the output signal of the inverter circuit INV7 becomes "H" (first voltage V1). The output signal LSO of the level conversion circuit LS to which this signal is supplied is "L" during delay time of the level conversion circuit LS. Thus, the PMOS transistor P2 is on. For the inverter circuit INV1 to which the output signal of the inverter circuit INV7 is supplied, the PMOS transistor P1 is set in a slightly on state from the on state to turn the NMOS transistor N1 ON. As a result, the output signal CKO is changed to "L", i.e., 0 V, at a high speed. Subsequently, when the output signal LSO of the level conversion circuit LS becomes "H", the PMOS transistor P2 is turned off to block a through-current.

According to the third embodiment, the inverter circuit INV7 is disposed before the inverter circuit INV1, and the inverter circuit INV1 and the level conversion circuit LS are controlled based on the output signal of the inverter circuit INV7. Therefore, when the input signal CKI is changed from "H" to "L", it is possible to change the output signal from "H" to "L" at a high speed.

The third embodiment can be applied to the second embodiment. That is, in FIG. 2, the inverter circuit INV2 is removed, and the inverter circuit INV7 is added as indicated by a broken line, whereby the output signal CKO can be changed from "H" to "L" at a high speed when the input signal CKI is changed from "H" to "L" by using the inverter circuit INV6 shown in FIG. 2.

Fourth Embodiment

Figure 4:
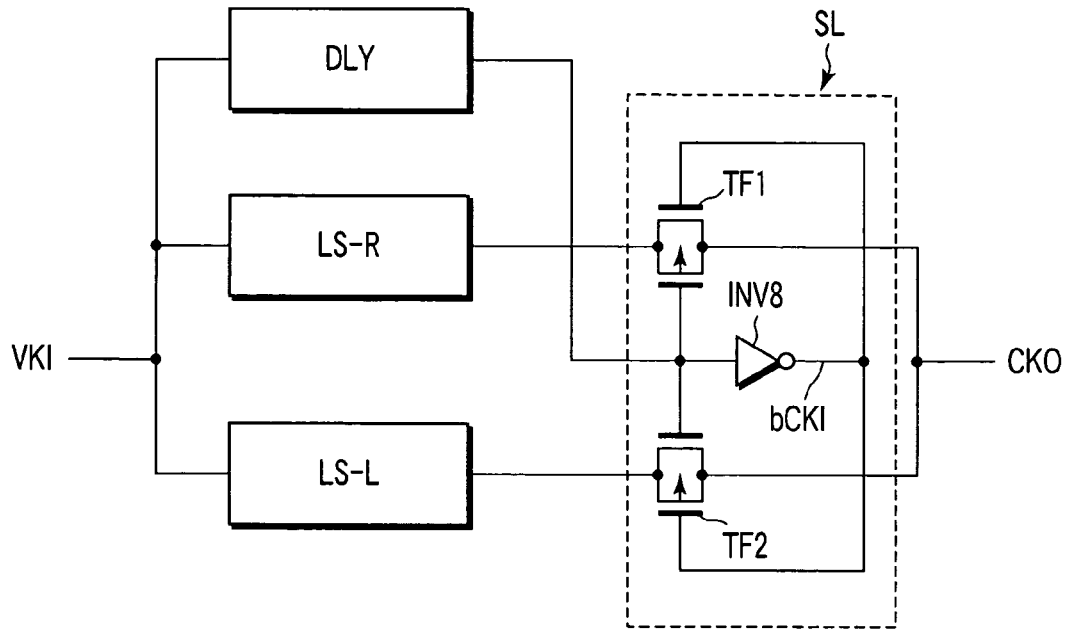
FIG. 4 is a circuit diagram showing a level conversion circuit according to a fourth embodiment.

FIG. 4 is a configuration diagram showing a fourth embodiment. According to the fourth embodiment, as in the case of the above, when an input signal CKI is "L" (0 V), "L" (0 V) is output for an output signal CKO. When the input signal CKI is "H" (first voltage V1), "H" (second voltage V2) is output for the output signal CKO. The first and second voltages V1 and V2 are set to, e.g., V1<V2. However, this is in no way limitative of a voltage relation.

Referring to FIG. 4, a level conversion circuit LS-R is identical to the circuit of the first or second embodiment, and designed to change an output signal CKO from "L" to "H" at a high speed when an input signal CKI changes from "L" to "H". On the other hand, a level conversion circuit LS-L is identical to the circuit of the third embodiment, and designed to change the output signal CKO from "H" to "L"

at a high speed when the input signal CKI changes from "H" to "L". Output signals of the level conversion circuits LS-R and LS-L are selected by a selection circuit SL. For example, the selection circuit SL comprises a first transfer gate TF1 whose input end is connected to an output end of the level conversion circuit LS-R, a second transfer gate TF2 whose input end is connected to an output end of the level conversion circuit LS-L, and an inverter circuit INV8. One of the first and second transfer gates TF1, TF2 is made conductive by an input signal CKI delayed as much as certain time by a delay circuit DLY and an input signal bCKI inverted by the inverter circuit INV8. Output ends of these transfer gates TF1, TF2 are commonly connected, and signals selected by the transfer gates TF1, TF2 are output as output signals CKO.

That is, when the input signal CKI is "L", the transfer gate TF1 is made conductive to output the output signal of the level conversion circuit LS-R as the output signal CKO. When the input signal CKI is "H", the transfer gate TF2 is made conductive to output the output signal of the level conversion circuit LS-L as the output signal CKO. When the input signal CKI changes from "L" to "H", the output signal of the level conversion circuit LS-R is quickly changed from "L" to "H", while the output signal of the level conversion circuit LS-L is changed from "L" to "H" after a passage of time necessary for a state change of the level conversion circuit LS. Alternatively, when the input signal CKI changes from "H" to "L", the output signal of the level conversion circuit LS-L is quickly changed from "H" to "L", while the output signal of the level conversion circuit LS-R is changed from "H" to "L" after a passage of time necessary for a state change of the level conversion circuit LS. The delay circuit DLY has delay time equal to or more than longer one of the state changes, and switches conductive states of the transfer gates TF1 and TF2 after the input signal CKI changes from "L" to "H" and "H" to "L" and the output signals of the level conversion circuits LS-L and LS-R match each other to control the selection circuit SL, thereby preventing an unstable state of the output signal CKO.

According to the fourth embodiment, the level conversion circuit LS-R for transmitting rising of a signal at a high speed, the level conversion circuit LS-L for transmitting falling of the signal at a high speed, and the selection circuit SL are disposed, and the output signals of the level conversion circuits LS-R, LS-L are selected by the selection circuit SL. As a result, signal changes of the input signal CKI from "H" to "L" and "L" to "H" can both be transmitted at a high speed, and the output signal CKO corresponding to the input signal CKI can be output.

Fifth Embodiment

Figure 5:
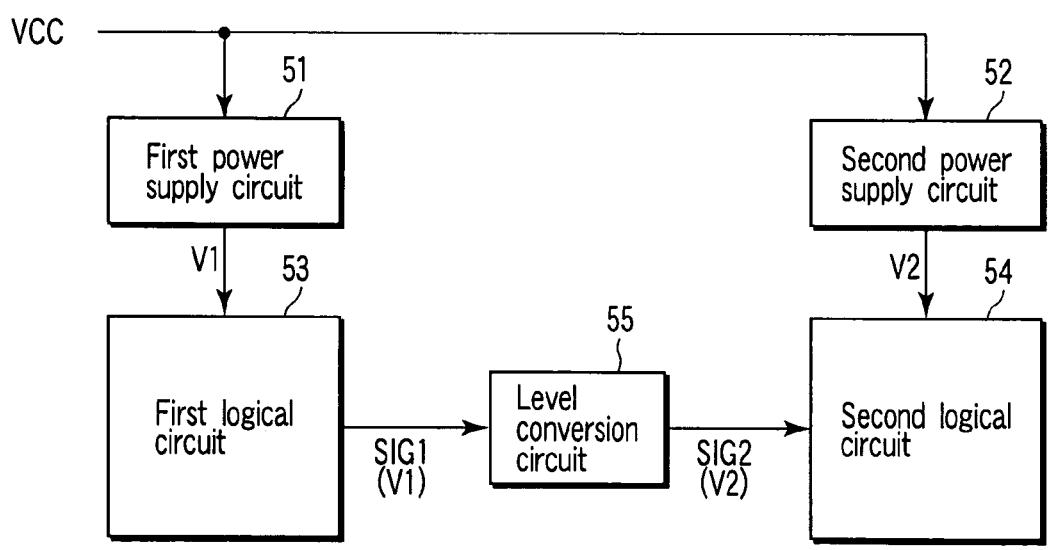
FIG. 5 is a block diagram showing a level conversion circuit according to a fifth embodiment.

FIG. 5 shows a fifth embodiment. The fifth embodiment shows an example in which each of the level conversion circuits of the aforementioned first to fourth embodiments is applied to a system-on-chip (SoC) or a memory LSI. Referring to FIG. 5, a first power supply circuit 51 generates a first voltage V1 from an external voltage VCC. A second power supply circuit 52 generates a second voltage V2 higher than, e.g., the first voltage V1, from the external voltage VCC. A first logical circuit 53 is operated by the first voltage V1 supplied from the first power supply circuit 51. A second logical circuit 54 is operated by the voltage V2 supplied from the second power supply circuit 52.

For a level conversion circuit 55, the level conversion circuit of one of the first to fourth embodiments is applied.

That is, the first and second embodiments are applied when a high speed must be achieved for rising timing of a signal, the third embodiment is applied when a high speed must be achieved for falling timing of the signal, and the fourth embodiment is applied when a high speed must be achieved for both rising and falling timing of the signal. In many application examples, one of rising and falling timing of the signal is often important. Accordingly, the level conversion circuits of the first to third embodiments are used in many cases. However, when change timing of both rising and falling of the signal is important, the level conversion circuit of the fourth embodiment is used.

By using the level conversion circuit 55, a signal SIG1 ("L"=0 V, "H"=first voltage V1) output from the first logical circuit 53 is converted into a signal SIG2 ("L"=0 V, "H"=second voltage V2), and supplied to the second logical circuit 54.

According to the fifth embodiment, by the level conversion circuit 55, a level of an input signal CKI can be converted to generate an output signal CKO, and output timing of the output signal can be set in accordance with circuit characteristics of the second logical circuit 54. As a result, it is possible to surely operate the first and second logical circuits 53, 54 driven by different voltages, and to improve reliability of the system-on chip device.

Sixth Embodiment

FIG. 6 shows a system-on-chip device according to a sixth embodiment. The system-on-chip (SoC) device comprises first and second system modules 61, 62, an I/O circuit 63, a system bus 64, a power supply circuit 65, a delay adjustment circuit 66, and level conversion circuits (LS1, LS2) 67, 68.

The first and second system modules 61, 62 have different calculation functions. For example, the first system module 61 is a module for processing an audio signal, and driven by an internal voltage VINT lower than a power supply voltage VCC and a clock signal CLKA lower than an external clock signal CLK. For example, the second system module is a module for processing a video signal, and driven by the power supply voltage VCC and the external clock CLK. The I/O circuit 63 operates as an interface circuit to transfer data with the first and second system modules 61, 62 via a system bus 64. The power supply circuit 65 is switched between standby and operated states by a control signal SP, and generates an internal voltage VINT from an external voltage VCC in the operated state. The delay adjustment circuit 66 delays the clock signal CLK supplied from the outside in accordance with a skewing amount between clock signals output from the first and second system modules 61, 62, and generates a clock signal CLKA to be supplied to the first system module 61.

The delay adjustment circuit 66 compares phases of clock signals CLK1 and CLK2 respectively output from the first and second system modules 61, 62 with each other, and delays the clock signal CLK to generate a clock signal CLKA in accordance with a result of the comparison so that skewing between the clocks CLK1 and CLK2 can be minimum. The first system module 61 operates by the internal voltage VINT lower than the external voltage VCC, while the second system module 62 and the delay adjustment circuit 66 operate by the external voltage VCC. Consequently, a clock signal CLK1 in which "L" is 0 V and "H" is an internal voltage VINT must be converted into a clock signal CLK1 in which "L" is 0 V and "H" is an external voltage VCC. Accordingly, the level conversion circuit 67 is connected between the delay adjustment circuit 66 and the first system module 67. For the level conversion circuit 67, one of the level conversion circuits of the first to fourth embodiments is applied. In this case, a first voltage V1 supplied to each inverter circuit is an internal voltage VINT, and a second voltage V2 is an external voltage VCC.

On the other hand, "L" is 0 V and "H" is an external voltage VCC for the clock signal CLK2 output from the second system module 62. Thus, a level conversion circuit is not necessary under normal circumstances. However, to maintain a relation of a signal delay between the clock signals CLK2 and CLK1, the level conversion circuit 68 is connected between the delay adjustment circuit 66 and the second system module 62. One of the first to fourth embodiments can be applied for the level conversion circuit 68. However, the first and second voltages V1, V2 supplied to the inverter circuits are all external voltages VCC.

Figure 7:
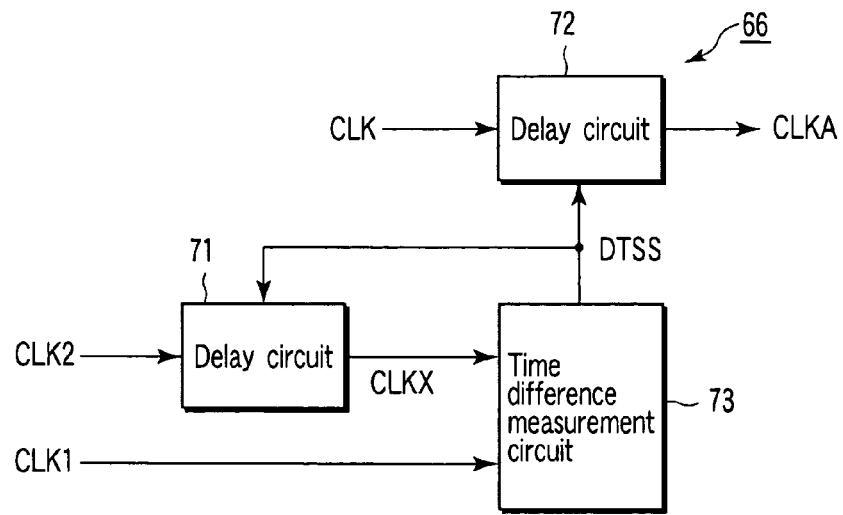
FIG. 7 is a block diagram showing a part of FIG. 6.

FIG. 7 shows an example of the delay adjustment circuit 66. For example, this delay adjustment circuit 66 comprises delay circuits 71, 72 and a time difference measurement circuit 73. The clock signal CLK1 is a signal output from the first system module CLK1 and passed through the level conversion circuit 67. This clock signal CLK1 is supplied to one input end of the time difference measurement circuit 73. The clock signal CLK2 is a signal output from the second system module 62 and passed through the level conversion circuit 68. The clock signal CLK2 is supplied to the delay circuit 71, and a clock signal CLKX delayed by the delay circuit 71 is supplied to the other input end of the time difference measurement circuit 73. The time difference measurement circuit 73 measures a time difference between the clock signals CLK1 and CLKX (shifting amount in change timing between the clock signals), and generates a signal DTSS corresponding to the measured time difference. This signal DTSS is supplied to the delay circuits 71, 72. The delay circuit 72 delays the clock signal CLK in accordance with the signal DTSS to generate a clock signal CLKA. The delay circuit 71 delays the clock signal CLK2 in accordance with the signal DTSS to generate a clock signal CLKX.

According to the sixth embodiment, for the clock signals CLK1, CLK2 supplied to the delay adjustment circuit 66 via the level conversion circuits 67, 68, a high speed can be achieved for signal transmission of the clock signals CLK1, CLK2 from "L" to "H" without any dependence on a difference between the first and second voltages (VINT, VCC). Hence, an error caused by a difference between the internal and external voltages VINT, VCC can be eliminated from transmission time of the clock signals CLK1, CLK2 supplied from the first and second system modules 61, 62 to the delay adjustment circuit 66. As a result, since a phase difference between the clock signals CLK1, CLK2 can be surely detected in the delay adjustment circuit 66, it is possible to accurately generate a clock signal CLKA.

According to the embodiments, the input signal is not limited to the clock signal, but any signals can be used as long as they change in steps.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A level conversion circuit comprising:
   a first inverter circuit having first and second transistors of first and second conductive types, one end of a current path of the first transistor being grounded, the other end thereof being connected to one end of a current path of the second transistor of the second conducive type, and a first input signal constituted of one of a ground potential and a first voltage higher than the ground potential being supplied to gates of the first and second transistors;
   a third transistor of a second conductive type connected between the other end of the current path of the second transistor and a second voltage higher than the first voltage, a control signal constituted of one of the ground potential and the second voltage being supplied to a gate of the third transistor behind a change of the first input signal,
   wherein a first output signal constituted of one of the ground potential and the second voltage is output from an output end of the first inverter circuit; and
   a control circuit whose input end is connected to the gates of the first and second transistors and whose output end is connected to the gate of the third transistor,
   wherein the control circuit outputs the control signal in accordance with the first input signal,
   the control circuit comprising:
   a fourth inverter circuit driven by the first voltage, the first input signal being supplied to an input end of the fourth inverter circuit;
   a fifth inverter circuit driven by the first voltage, an output signal of the fourth inverter circuit being supplied to an input end of the fifth inverter circuit;
   a differential amplifier circuit driven by the second voltage to amplify and output a difference voltage between input and output signals of the fifth inverter circuit; and
   a sixth inverter circuit driven by the second voltage, an output signal of the differential amplifier circuit being supplied to an input end of the sixth inverter circuit, and the control signal being output from an output end thereof.

2. The circuit according to claim 1, further comprising a second inverter circuit connected to the output end of the first inverter circuit to be operated by the second voltage,
   wherein driving efficiencies of the first to third transistors are set such that a potential of the output end is lower than a threshold voltage of the second inverter circuit when the first voltage is supplied to the gates of the first and second transistors and the ground potential is supplied to the gate of the third transistor.

3. The circuit according to claim 1, further comprising a third inverter circuit driven by the first voltage, a second input signal constituted of one of the ground potential and the first voltage being supplied to an input end of the third inverter circuit, and an output end thereof being connected to the gates of the first and second transistors.

4. The circuit according to claim 1, further comprising:
   a first level conversion circuit which transmits rising of an input signal faster than falling;
   a second level conversion circuit which transmits falling of the input signal faster than rising;
   a delay circuit which delays the input signal by certain time; and
   a selection circuit which outputs one of output signals of the first and second level conversion circuits in accordance with an output signal of the delay circuit, wherein the first level conversion circuit comprises the level conversion circuit according to claim 1.

5. The circuit according to claim 4, the second level conversion circuit comprising:
- a second inverter circuit which includes fourth and fifth transistors of first and second conductive types, one end of a current path of the fourth transistor being grounded, one end of a current path of the fifth transistor of the second conducive type being connected to the other end, and the input signal constituted of one of a ground potential and a first voltage higher than the ground potential being supplied to gates of the fourth and fifth transistors;
- a sixth transistor of a second conductive type connected between the other end of the current path of the fifth transistor and a second voltage higher than the first voltage, a control signal constituted of one of the ground potential and the second voltage being supplied to a gate of the sixth transistor behind a change of the input signal; and
- a third inverter circuit driven by the first voltage, the input signal being supplied to an input end of the third inverter circuit, and an output end thereof being connected to the gates of the fourth and fifth transistors.

6. The circuit according to claim 1, further comprising:
- a first power supply circuit which outputs a first voltage;
- a second power supply circuit which outputs a second voltage;
- a first logical circuit driven by the first voltage supplied from the first power supply circuit to output a first signal of the first voltage;
- a second logical circuit driven by the second voltage supplied from the second power supply circuit to output a second signal of the second voltage; and
- the level conversion circuit connected between the first and second logical circuits to convert the first signal of the first voltage into the second signal of the second voltage.

7. A semiconductor device comprising:
- a first logical circuit driven by a first voltage and a first clock signal to output a second clock signal of the first voltage;
- a second logical circuit driven by a second voltage higher than the first voltage and a third clock signal as a reference to output a fourth clock signal of the second voltage;
- a level conversion circuit which converts the second clock signal output from the first logical circuit into a second clock signal of the second voltage; and
- a delay control circuit to which the second clock signal of the second voltage output from the level conversion circuit, the fourth clock signal of the second voltage output from the second logical circuit, and the third clock signal are supplied, and which detects a skew amount between the second and fourth clock signals, and which generates the first clock by delaying the third clock in accordance with the detected skew amount between the second and fourth clock signals.

8. The device according to claim 7, the level conversion circuit comprising:
- a first inverter circuit which includes first and second transistors of first and second conductive types, one end of a current path of the first transistor being grounded, one end of a current path of the second transistor of the second conducive type being connected to the other end, and a first input signal constituted of one of a ground potential and a first voltage higher than the ground potential being supplied to gates of the first and second transistors; and
- a third transistor of a second conductive type connected between the other end of the current path of the second transistor and a second voltage higher than the first voltage, a control signal constituted of one of the ground potential and the second voltage being supplied to a gate of the third transistor behind a change of the first input signal,
- wherein an output signal constituted of one of the ground potential and the second voltage is output from an output end of the first inverter circuit.

9. The circuit according to claim 8, further comprising a logical circuit connected to the output end of the first inverter circuit to be operated by the second voltage,
- wherein driving efficiencies of the first to third transistors are set such that a potential of the output end is lower than a threshold voltage of the logical circuit when the first voltage is supplied to the gates of the first and second transistors and the ground potential is supplied to the gate of the third transistor.

10. The circuit according to claim 8, further comprising a third inverter circuit driven by the first voltage, a second input signal constituted of one of the ground potential and the first voltage being supplied to an input end of the third inverter circuit, and an output end thereof being connected to the gates of the first and second transistors.

11. The circuit according to claim 8, further comprising a control circuit whose input end is connected to the gates of the first and second transistors and whose output end is connected to the gate of the third transistor,
- wherein the control circuit outputs the control signal in accordance with the first input signal.

12. The circuit according to claim 8, the control circuit comprising:
- a fourth inverter circuit driven by the first voltage, the first input signal being supplied to an input end of the fourth inverter circuit;
- a fifth inverter circuit driven by the first voltage, an output signal of the fourth inverter circuit being supplied to an input end of the fifth inverter circuit;
- a differential amplifier circuit driven by the second voltage to amplify and output a difference voltage between input and output signals of the fifth inverter circuit; and
- a sixth inverter circuit driven by the second voltage, an output signal of the differential amplifier circuit being supplied to an input end of the sixth inverter circuit, and the control signal being output from an output end thereof.

13. The circuit according to claim 7, the delay control circuit comprising:
- a first delay circuit which delays the fourth clock signal in accordance with a control signal;
- a second delay circuit which delays the third clock signal in accordance with the control signal in the same amount with the first delay circuit and generate the first clock signal; and
- a measurement circuit to which the second clock signal and the delayed fourth clock signal output from the first delay circuit are supplied, and which measures a time difference between the second clock signal and the delayed fourth clock signal to output the control signal in accordance with the measured time difference.

* * * * *